United States Patent [19]

Steele et al.

[11] Patent Number: 5,273,930
[45] Date of Patent: Dec. 28, 1993

[54] METHOD OF FORMING A NON-SELECTIVE SILICON-GERMANIUM EPITAXIAL FILM

[75] Inventors: John W. Steele, Chandler; Edouard D. de Frésart, Tempe, both of Ariz.

[73] Assignee: Motorola, Inc., Schaumburg, Ill.

[21] Appl. No.: 940,402

[22] Filed: Sep. 3, 1992

[51] Int. Cl.$^5$ .......................................... H01L 21/203
[52] U.S. Cl. ...................................... 437/89; 437/106; 437/131
[58] Field of Search ................. 437/89, 103, 106, 131, 437/965; 156/613; 148/33.4, DIG. 58, DIG. 59, DIG. 169

[56] References Cited

U.S. PATENT DOCUMENTS

| | | | |
|---|---|---|---|
| 4,857,270 | 8/1989 | Maruya et al. | 437/131 |
| 5,202,284 | 4/1993 | Kamins et al. | 437/106 |
| 5,221,413 | 6/1993 | Brasen et al. | 156/613 |

OTHER PUBLICATIONS

Srinivasan, "Recent Advances in Silicon Epitaxy and its Application to High Performance Integrated Circuits," J. of Crystal Growth, vol. 70, 1984, pp. 201-217.

Primary Examiner—Brian E. Hearn
Assistant Examiner—C. Chaudhari
Attorney, Agent, or Firm—Rennie William Dover; Joe E. Barbee

[57] ABSTRACT

A method of forming a silicon-germanium epitaxial layer using dichlorosilane as a silicon source gas. A semiconductor seed layer (15) is formed on a portion of a semiconductor layer (12) and on a portion of a layer of dielectric material (13). The semiconductor seed layer (15) provides nucleation sites for a Si-Ge epitaxial alloy layer (16). The epitaxial film (16) is formed on the semiconductor seed layer (15). Both the semiconductor seed layer (15) and the Si-Ge epitaxial film (16) are formed at a system growth pressure between approximately 25 and 760 millimeters of mercury and a temperature below approximately 900° C. The semiconductor seed layer (15) and the Si-Ge epitaxial film (16) permit fabrication of a heterostructure semiconductor integrated circuit (10), thereby allowing the exploitation of bandgap engineering techniques.

18 Claims, 1 Drawing Sheet

METHOD OF FORMING A NON-SELECTIVE SILICON-GERMANIUM EPITAXIAL FILM

BACKGROUND OF THE INVENTION

This invention relates, in general, to formation of semiconductor films and, more particularly, to formation of epitaxial films.

Fabrication of semiconductor integrated circuits entails a multitude of processing steps including epitaxial film formation, dielectric film formation, photolithography, etching, impurity doping, passivation, packaging, and testing. Manufacturers of semiconductor integrated circuits are continually refining and optimizing these processing steps in an effort to improve the performance of their products as well as decrease manufacturing costs and cycle times. Many semiconductor manufacturers are turning to silicon-germanium (Si-Ge) heterostructure semiconductor technology as an alternative to silicon semiconductor technology. Advantages of Si-Ge heterostructure devices over their silicon counterparts include a lower bandgap energy, a higher emitter injection efficiency, reduced charge storage in the emitters of bipolar transistors, and a lower base transit time.

A critical step in the formation of Si-Ge heterostructure devices is formation of an epitaxial film or layer. Typically, a Si-Ge epitaxial film is formed at temperatures below approximately 800° C. by techniques such as molecular beam epitaxy (MBE) and ultra-high vacuum chemical vapor deposition (UHV/CVD). It is preferable that Si-Ge epitaxial film formation be performed at temperatures below approximately 800° C. to prevent thermal relaxation of a strained Si-Ge epitaxial film. However, at these temperatures the silicon and germanium in source gases comprising these elements are selectively deposited on semiconductor substrate material and not on a dielectric material overlying portions of the semiconductor substrate material; a phenomenon which precludes formation of a blanket Si-Ge epitaxial film. Additionally, a single silicon source gas, such as silane, is used in these systems.

Furthermore, any contaminants such as oxygen and water vapor that may be incorporated into the semiconductor material during deposition would degrade material quality. To prevent incorporation of contaminants, Si-Ge heterostructure epitaxial growth is carried out, for example, in UHV/CVD reactors, wherein a system growth pressure of approximately $1 \times 10^{-3}$ millimeters of mercury (mm Hg) may be achieved. A system growth pressure of approximately $1 \times 10^{-3}$ mm Hg requires a background pressure of lower than $1 \times 10^{-8}$ mm Hg. Pumping a UHV/CVD reactor chamber to pressures of approximately $1 \times 10^{-8}$ mm Hg is time consuming and requires expensive and fragile equipment such as turbo-molecular pumps and the like.

Accordingly, it would be advantageous to have a method for forming a Si-Ge epitaxial film on both semiconductor and dielectric materials using more than a single source gas for the silicon and using chemical vapor deposition reactors other than those employing ultra-high vacuum. It would be further advantageous to have a method that is easily integrated into heterostructure processes, has reduced loading effects, and has the capability of producing a heavily doped epitaxial layer.

SUMMARY OF THE INVENTION

Briefly stated, the present invention is a method of forming a non-selective silicon-germanium epitaxial film using dichlorosilane as a source gas for silicon. The method includes providing a semiconductor layer having a patterned dielectric material through which a portion of the semiconductor layer is exposed. A semiconductor seed layer is deposited on the exposed portion of the semiconductor layer and a portion of the dielectric material. The silicon-germanium epitaxial film is deposited on the semiconductor seed layer. The silicon-germanium epitaxial film is deposited at a system growth pressure ranging between approximately 25 and 760 mm Hg.

DETAILED DESCRIPTION OF THE DRAWINGS

Si-Ge heterostructure epitaxial films may be formed by such techniques as chemical vapor deposition (CVD) or molecular beam epitaxy (MBE). The crystal lattice of the Si-Ge epitaxial film becomes strained due to crystal lattice mismatches. An advantage of the Si-Ge in this film is its lower bandgap energy compared to a silicon epitaxial film, a phenomenon exploited in bandgap engineering.

In bandgap engineered Si-Ge epitaxial growth, the temperature should be limited to a value less than approximately 900° C. to prevent strain relaxation. Even at temperatures below approximately 900° C., the deposition of a semiconductor material from a source gas containing chlorine is selective, thus epitaxial deposition occurs on a semiconductor material and not on a dielectric material. In fact, extremely thin layers of a dielectric material such as oxide inhibits formation of the Si-Ge epitaxial film on a silicon layer.

The present invention teaches a method of forming a semiconductor seed layer or a nucleation layer on both a semiconductor material and a dielectric material at temperatures below approximately 900° C. using atmospheric pressure chemical vapor deposition (APCVD) reactors or reduced pressure chemical vapor deposition (RPCVD) reactors. The semiconductor seed layer provides nucleation sites for the formation of a blanket epitaxial film over both dielectric material and semiconductor material. The semiconductor seed layer and the blanket epitaxial film have an oxygen content of less than approximately $5 \times 10^{18}$ atoms per cubic centimeter as determined using secondary ion mass spectrometry (SIMS).

Figure 1:
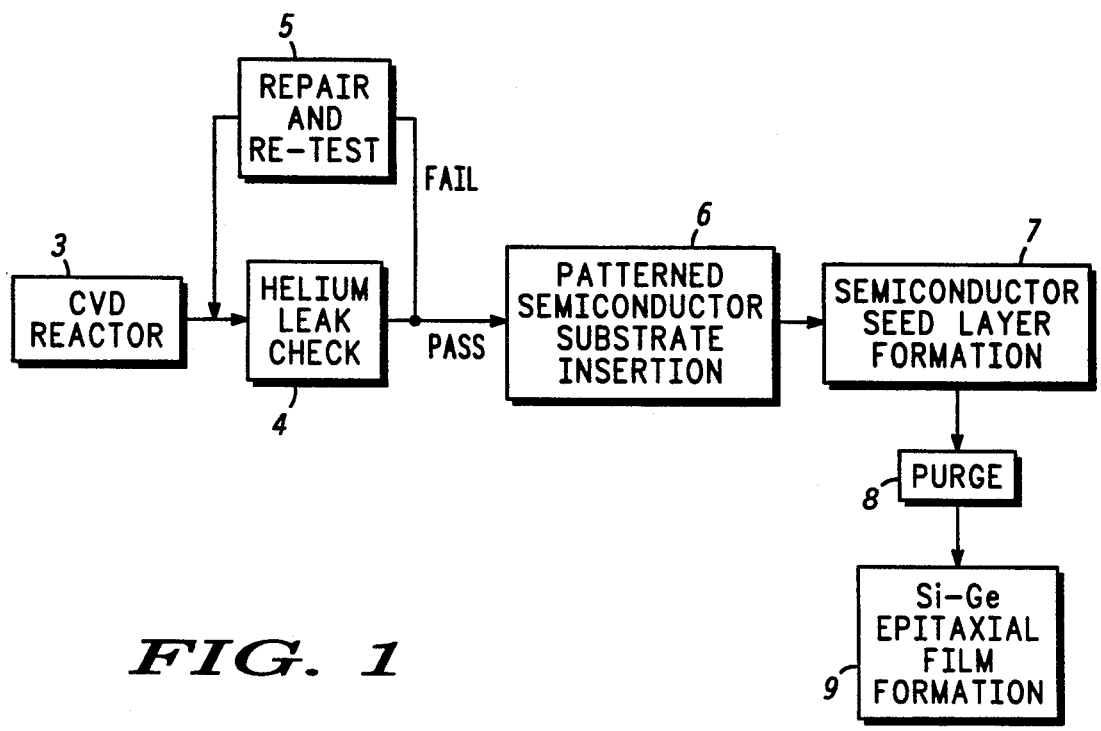
FIG. 1 illustrates a process flow diagram in accordance with the present invention.

In a preferred embodiment of a process teaching formation of a semiconductor seed layer and a Si-Ge epitaxial film, an APCVD or an RPCVD reactor is provided as indicated by a block 3 of the process flow diagram shown in FIG. 1. APCVD and RPCVD reactors include a plurality of source gas feed lines including gas feed lines for hydrogen, silane, germane, dichlorosilane, arsine, phosphine, and diborane. Individuals skilled in the art are aware of many suitable CVD reactors such as an ASM Epsilon one 2e, an AMT 7810, and the like.

In preparation for chemical vapor deposition, a helium leak check is performed on the CVD reactor as shown by block 4 of FIG. 1. The CVD reactor must pass a helium leak check of less than approximately $1 \times 10^{-8}$ mm Hg. Compliance with the helium leak check ensures that contaminants such as oxygen and water vapor do not enter the CVD reactor and form an oxide layer on a silicon epitaxial layer over which a Si-Ge epitaxial film is to be grown. Further, passing the helium leak check ensures source gases such as silane and dichlorosilane do not interact with each other via leaks in the gas feed lines or the associated fittings. It is especially important that the CVD reactor pass the helium leak test when using gases that are highly reactive with one another (such as silane and dichlorosilane) to prevent possible adverse reactions. A CVD reactor failing the helium leak test must be repaired and rechecked until it passes the helium leak test as indicated in the feedback portion (block 5) of the flow diagram of FIG. 1 labelled "Repair and Re-test". A CVD reactor passing the helium leak test is said to be an ultra-clean reactor.

The helium leak check may be performed, for example, by connecting a turbo-helium leak detector to the CVD reactor, coating an exterior portion of the fittings connected to the reactor with helium, and checking for the presence of helium within the CVD reactor. Helium leak checks and procedures for performing helium leak checks are well known to those skilled in the art.

In the preferred embodiment a semiconductor substrate comprising a silicon epitaxial layer and a patterned oxide layer disposed thereon is placed in a suitable chemical vapor deposition (CVD) reactor chamber, for example an ASM Epsilon one 2e. This procedure is illustrated as a block 6 in the flow diagram of FIG. 1. A first phase includes a hydrogen heat up step wherein the pressure within the reactor chamber is set to, approximately, 60 mm Hg and a hydrogen flow rate into the chamber is approximately 120 standard liters per minute (slm). In addition, the temperature within the reactor chamber is increased to approximately 1,000° C. The hydrogen heat up step lasts approximately four minutes. Following the hydrogen heat up step, the reactor chamber undergoes a hydrogen pre-bake step wherein the environment within the chamber is maintained at a temperature, a pressure, and a hydrogen flow rate of, approximately, 1,000° C., 60 mm Hg, and 120 slm, respectively. The hydrogen pre-bake step lasts for approximately 10 minutes.

After the hydrogen pre-bake step, the temperature within the reactor chamber is reduced to below approximately 900° C. in a series of steps, and the silane source gas feed line is purged with silane for approximately 3 minutes. Preferably, the temperature is set to approximately 750° C. Following the approximately 3 minute purge; a semiconductor seed layer is formed by introducing a silane source gas into the reactor chamber at a flow rate and time of approximately 5 slm and 5 minutes, respectively. Semiconductor seed layer formation is shown as block 7 of the flow diagram of FIG. 1. Under these conditions a semiconductor seed layer of approximately 100 nm is formed. Thus, a semiconductor seed layer is formed at a temperature less than approximately 900° C. Although the semiconductor seed layer formed in this embodiment has a thickness of approximately 100 nm, it shall be understood that the semiconductor seed layer may be as thin as approximately 2.5 nm and still provide nucleation sites for growth of the epitaxial alloy layer. A hydrogen purge of the silane source gas line is performed for approximately 2 minutes to remove any residual silane in the silane source gas feed line. The hydrogen purge step is important to prevent any residual silane in the CVD reactor from interacting with a dichlorosilane source gas used in the second phase and is indicated as a purge block 8 of FIG. 1.

In a second phase, the temperature within the reactor chamber is lowered to approximately 700° C. In preparation for formation of a silicon-germanium epitaxial alloy (shown as reference numeral 9 in the flow diagram of FIG. 1), the dichlorosilane source gas feed line and the germanium source gas feed line are purged with dichlorosilane and germane, respectively, for approximately 2 minutes. Formation of the Si-Ge epitaxial film is performed in a multi-step sequence, wherein the reaction mixture flowing into the reactor chamber has decreasing levels of germanium with each successive step. The Si-Ge epitaxial film is also referred to as a Si-Ge epitaxial alloy layer. The hydrogen flow rate is decreased to approximately 50 slm and the pressure is reduced to approximately 40 mm Hg. Silicon is introduced in a dichlorosilane source gas through the dichlorosilane source gas feed line at a flow rate of approximately 80 standard cubic centimeters per minute (sccm). Simultaneously, germanium is introduced in a germane source gas, through the germane source gas feed line, in an eight step Si-Ge alloy forming sequence, each Si-Ge alloy forming step lasting approximately 35 seconds. Preferably, the germane source gas comprises approximately 10% germane by weight in hydrogen. The flow rate of the germane source gas may range from approximately 0 to 100 sccm. In a first alloy film forming step, the flow rate of the germane source gas is approximately 60 sccm, thereby producing an alloy film having a germanium concentration of approximately 17.5% by weight. In a second alloy film forming step, the flow rate of the germane source gas is reduced to approximately 35 sccm, thereby producing an alloy film having a concentration of germanium of approximately 15% by weight. In a third alloy film forming step, the flow rate of the germane source gas is reduced to approximately 25 sccm, thereby producing an alloy having a concentration of germanium of approximately 12.5% by weight.

A third phase begins with a fourth alloy film forming step. In addition to supplying dichlorosilane at a flow rate of approximately 80 sccm, this step includes purging the diborane source gas line. Diborane serves as a boron dopant for applications requiring a boron doped epitaxial layer. The flow rate of the germane source gas is reduced to approximately 15 sccm, thereby producing an alloy film having a concentration of germanium of approximately 10% by weight. In a fifth, sixth, seventh, and eighth alloy film forming steps the flow rate of germane is reduced to approximately 5, 2, 1, and 0 sccm, respectively, producing films having concentrations of germanium of approximately 7.5%, 5%, 2.5%, and 0%, respectively. During the fifth through the eighth alloy forming steps the flow rate of dichlorosilane is approximately 80 sccm and the flow rate of diborane is approximately 40 sccm. It shall be understood that the presence or absence of a dopant or impurity material is not a limitation of the present invention. Further, the dopant is not limited to boron. In a first example the dopant may be arsenic, introduced as arsine through an arsine gas feed line, and in a second example the dopant may be phosphorous, introduced as phosphine through the phosphine gas feed line.

A fourth phase includes a purge step wherein the dichlorosilane and the diborane source gas feed lines are purged for approximately 2 minutes. Subsequent to purging the dichlorosilane and diborane source gas feed lines, the silane and arsine source gas feed lines are purged with hydrogen for approximately 2 minutes. The hydrogen purge steps are important to prevent any residual dichlorosilane from interacting with a silane source gas which may be used in a subsequent step.

A layer of polysilicon having a thickness of approximately 300 nm may be formed by supplying the silane source gas through the silane source gas feed line at a flow rate of approximately 5 slm for approximately 20 minutes. Finally, the silane and arsine source gas feed lines are purged and the reactor chamber back-filled for approximately 5 minutes. The semiconductor substrate having the Si-Ge epitaxial film may be removed from the reactor chamber for subsequent processing, wherein the subsequent processing may include formation of a heterostructure bipolar junction transistor as described in the description of FIG. 2.

Thus, the process of the preferred embodiment teaches a method for forming a semiconductor seed layer over a semiconductor epitaxial layer and a dielectric layer, and in particular over a semiconductor layer and an oxide dielectric layer. The semiconductor seed layer provides nucleation sites, thereby permitting nucleation of an epitaxial alloy layer on both a semiconductor material and a dielectric material. The portion of the semiconductor seed layer and the Si-Ge epitaxial film over the semiconductor layer forms a monocrystalline structure, and the portion of the semiconductor seed layer and the silicon-germanium epitaxial layer over the oxide dielectric material forms a polycrystalline structure.

In general, heterostructure semiconductor integrated circuits comprise a semiconductor substrate having a plurality of layers disposed thereon. More particularly, the plurality of layers forming a heterostructure bipolar transistor includes a collector region, an emitter region, and a base region. The base region may be formed from the Si-Ge epitaxial film and includes an intrinsic base portion and an extrinsic base portion. The intrinsic base portion is that portion of the Si-Ge epitaxial film formed on a semiconductor material, whereas the extrinsic base portion includes that portion of the epitaxial film formed on a dielectric material.

Figure 2:
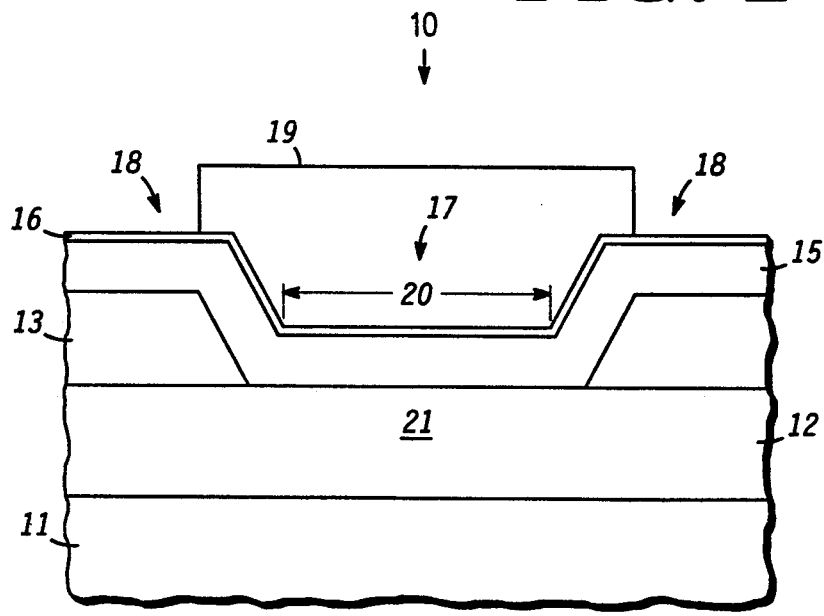
FIG. 2 illustrates a highly enlarged cross-sectional view of a portion of a heterostructure bipolar transistor in accordance with the present invention.

FIG. 2 illustrates a highly enlarged cross-sectional view of a heterostructure bipolar transistor 10 in accordance with the present invention. FIG. 2 shows a semiconductor substrate 11 having a doped silicon epitaxial layer 12, and an oxide layer 13 disposed thereon. Methods of forming doped epitaxial layers and oxide films are well known to those skilled in the art.

A first photoresist mask (not shown) is formed on oxide layer 13 and is used to define a collector opening through oxide layer 13. The collector opening may be formed by etching with a wet etchant such as a dilute hydrofluoric acid solution or one of many wet or dry etches known in the art. The etch, and therefore the collector opening, stops on doped epitaxial layer 12, thereby exposing a portion of doped epitaxial layer 12. The first photoresist mask is removed. This photoresist mask may be removed using a phenol-based stripper or other resist stripping techniques known by those skilled in the art.

A semiconductor seed layer 15 is formed over the exposed portion of doped epitaxial layer 12 and over the exposed portion of oxide layer 13 wherein the seed layer is formed using a silane chemistry. Preferably, semiconductor seed layer 15 comprises silicon and has a thickness of approximately 100 nm. A Si-Ge epitaxial film 16 is formed over semiconductor seed layer 15 wherein the seed layer is formed using a dichlorosilane chemistry. Preferably, Si-Ge epitaxial film 16 has a thickness of approximately 80 nm. Details of forming semiconductor seed layer 15 and Si-Ge epitaxial film 16 are further explained in the discussion of the preferred embodiment.

Semiconductor seed layer 15 is a layer of semiconductor material on oxide layer 13 and a portion of epitaxial layer 12. Semiconductor seed layer 15 serves as a nucleation layer by providing a plurality of nucleation sites for the deposition of Si-Ge epitaxial film 16. It shall be understood that the thickness of semiconductor seed layer 15 is not a limitation of the present invention. Semiconductor seed layers having thicknesses of approximately 2.5 nm provide sufficient nucleation sites to form an epitaxial film over both semiconductor and dielectric materials. A portion of semiconductor seed layer 15 and Si-Ge epitaxial film 16 serve as a base region of heterostructure bipolar transistor 10.

A polysilicon layer (not shown) is formed on Si-Ge epitaxial film 16. Preferably, the polysilicon layer has a thickness of approximately 300 nm. The process steps for forming the polysilicon layer may immediately follow the process steps for forming Si-Ge epitaxial film 16, thus the details of embodiments teaching these processing steps are provided in the description of the first and second embodiments. A second photoresist mask (not shown) is formed on the polysilicon layer, wherein the second photoresist mask defines an emitter region 19 of heterostructure bipolar transistor 10. Emitter region 19 of the polysilicon layer is protected by the second photoresist mask, whereas those regions left unprotected are etched using, for example, a chlorine chemistry reactive ion etch. The second photoresist mask is removed in a manner as described for removal of the first photoresist mask.

Thus, heterostructure bipolar transistor 10 is formed having a base region, a collector region 21, and an emitter region 19. The base region comprises semiconductor seed layer 15 and Si-Ge epitaxial film 16 and includes an intrinsic base portion 17 and an extrinsic base portion 18. Intrinsic base portion 17 is shown in FIG. 2 as the region bounded by lines 20. Extrinsic base portion 18 is contiguous with intrinsic base portion 17, extending a predetermined distance away from lines 20. For example, extrinsic base portion 18 may extend 0.5 microns ($\mu$m) from lines 20. Emitter region 19 comprises a portion of the polysilicon layer and collector region 21 comprises a portion of epitaxial layer 12. Electrodes contacting the extrinsic base, emitter, and collector regions 18, 19, and 21, respectively, may be formed by techniques well known to those skilled in the art.

It shall be understood that the present invention teaches a method for forming semiconductor seed layer 15 and a Si-Ge epitaxial film 16, wherein semiconductor seed layer 15 provides nucleation sites for formation of Si-Ge epitaxial film 16. A portion of semiconductor seed layer 15 cooperates with a portion of Si-Ge epitaxial film 16 to form a base region, wherein the base region comprises intrinsic base portion 17 and extrinsic base portion 18. Further, the formation of semiconductor seed layer 15 and Si-Ge epitaxial film 16 may be incorporated into many processing schemes for forming heterostructure semiconductor integrated circuits.

By now it should be appreciated that there has been provided a method of non-selectively depositing a semiconductor seed layer on both a semiconductor material and a dielectric material. The semiconductor seed layer provides nucleation sites for subsequent formation of an epitaxial alloy layer. The epitaxial alloy layer serves as a semiconductor material co-deposition layer wherein silicon and germanium are co-deposited. Both the semiconductor seed layer and the Si-Ge epitaxial film are formed at a temperature ranging between approximately 600° C. and 850° C. and a pressure ranging between approximately 25 and 760 mm Hg. Thus, formation of the semiconductor seed layer permits low temperature growth of the Si-Ge epitaxial film in APCVD and RPCVD reactors using standard heterostructure processing steps. Since the semiconductor seed layer permits growing an epitaxial alloy layer on a dielectric material, including the semiconductor seed layer permits implementing an isolation scheme before the epitaxial base to emitter processing steps, thereby limiting a high temperature processing step. Processing heterostructure semiconductor integrated circuits at lower temperatures decreases strain relaxation and results in an epitaxial structure having a lower bandgap energy.

Moreover, formation of the semiconductor seed layer decreases loading effects by providing a layer of nucleation sites on a dielectric layer to which an epitaxial alloy layer may adhere. Thus, the semiconductor seed layer ensures adhesion by the epitaxial alloy layer independent of the number of wafers being processed in the CVD system. Further, since the semiconductor seed layer promotes adhesion of the epitaxial alloy layer to a dielectric material, highly doped extrinsic base portions may be formed.

We claim:

1. A method of forming a non-selective silicon-germanium epitaxial film, comprising the steps of:
    providing a chemical vapor deposition system, wherein the chemical vapor deposition system has a helium leak rate less than approximately $1 \times 10^{-8}$ millimeter of mercury (mm Hg);
    placing a semiconductor substrate into the chemical vapor deposition system, the semiconductor substrate comprising a semiconductor layer and a patterned oxide layer disposed thereon, wherein a portion of the semiconductor layer is exposed through the patterned oxide layer;
    forming a silicon seed layer on the patterned oxide layer and the exposed portion of the semiconductor layer, wherein silane is a silicon source gas; and
    forming a silicon-germanium epitaxial film on the silicon seed layer using dichlorosilane as a silicon source gas and germane as a germanium source gas, wherein this step is performed at a system growth pressure ranging between, approximately, 25 and 760 mm Hg and a temperature ranging between approximately 600° C. and 850° C.

2. A method of forming a non-selective silicon-germanium epitaxial film as claimed in claim 1, wherein the step of forming the semiconductor seed layer includes forming the semiconductor seed layer at a temperature lower than approximately 900° C.

3. A method of forming a non-selective silicon-germanium epitaxial film as claimed in claim 1, wherein the step of forming the silicon-germanium epitaxial film includes providing a doping material in the silicon-germanium epitaxial film.

4. A method of forming a non-selective silicon-germanium epitaxial film as claimed in claim 3, further including providing a diborane source gas as the doping material, the diborane source gas providing boron as a dopant.

5. A method of forming a non-selective silicon-germanium epitaxial film as claimed in claim 3, further including providing an arsine source gas as the doping material, the arsine source gas providing arsenic as a dopant.

6. A method of forming a non-selective silicon-germanium epitaxial film as claimed in claim 3, further including providing a phosphine source gas as the doping material, the phosphine source gas providing phosphorous as a dopant.

7. A method of forming a non-selective semiconductor material co-deposition layer, comprising the steps of:
    providing a semiconductor substrate having a layer of dielectric material disposed thereon, the layer of dielectric material patterned to expose a portion of the semiconductor substrate;
    depositing a semiconductor seed layer on the layer of dielectric material and the exposed portion of the semiconductor substrate; and
    co-depositing silicon from a dichlorosilane source gas and germanium from a germane source gas on the semiconductor seed layer, wherein a system growth pressure for co-deposition ranges between approximately 25 and 760 millimeter of mercury (mm Hg) and a temperature range between approximately 600 and 850° C.

8. A method of forming a non-selective semiconductor material co-deposition layer as claimed in claim 7 wherein the step of forming the semiconductor seed layer includes forming the semiconductor seed layer as silicon using silane as a silicon source gas.

9. A method of forming a non-selective semiconductor material co-deposition layer as claimed in claim 7 further including performing the steps of depositing a semiconductor seed layer and a co-depositing the silicon in an atmospheric pressure chemical vapor deposition system or a reduced pressure chemical vapor deposition system having a helium leak rate less than approximately $1 \times 10^{-8}$ mm Hg.

10. A method of forming a non-selective silicon-germanium co-deposition layer as claimed in claim 7 wherein the step of co-depositing silicon and germanium includes depositing boron from a diborane source gas.

11. A method of forming a non-selective silicon-germanium co-deposition layer as claimed in claim 7 wherein the step of co-depositing silicon and germanium includes depositing arsenic from an arsine source gas.

12. A method of forming a non-selective silicon-germanium co-deposition layer as claimed in claim 7 wherein the step of co-depositing silicon and germanium includes depositing phosphorus from a phosphine source gas.

13. A method of forming a heterostructure semiconductor integrated circuit, comprising the steps of:
    providing a semiconductor substrate having a doped epitaxial layer disposed thereon;
    providing a layer of dielectric material on the doped epitaxial layer;

forming a collector opening through the layer of dielectric material, the collector opening exposing a portion of the doped epitaxial layer;

forming a semiconductor seed layer on the exposed portion of the doped epitaxial layer and on a portion of the layer of dielectric material at a system growth pressure ranging between approximately 25 and 760 millimeters of mercury (mm Hg), and a temperature less than approximately 900° C.;

forming an epitaxial film on the semiconductor seed layer at a system growth pressure ranging between approximately 25 and 760 mm Hg, and a temperature ranging between approximately 600° and 850° C., the semiconductor seed layer and the epitaxial film cooperating to form a base region;

forming a polysilicon layer on the epitaxial alloy layer; and forming an emitter region from the polysilicon layer.

14. A method of forming a heterostructure semiconductor integrated circuit as claimed in claim 13 wherein the step of forming the semiconductor seed layer includes forming the semiconductor seed layer from a source gas comprising silane.

15. A method of forming a heterostructure semiconductor integrated circuit as claimed in claim 13 wherein the step of forming the epitaxial film includes forming the epitaxial film from source gases comprising dichlorosilane and germane.

16. A method of forming a heterostructure semiconductor integrated circuit as claimed in claim 13 wherein the step of forming the epitaxial film includes doping the epitaxial film with boron.

17. A method of forming a heterostructure semiconductor integrated circuit as claimed in claim 13 wherein the step of forming the epitaxial film includes doping the epitaxial film with arsenic.

18. A method of forming a heterostructure semiconductor integrated circuit as claimed in claim 13 wherein the step of forming the epitaxial film includes doping the epitaxial film with phosphorous.

* * * * *